United States Patent
Kojimaru et al.

(10) Patent No.: US 7,964,042 B2
(45) Date of Patent: Jun. 21, 2011

(54) SUBSTRATE PROCESSING APPARATUS AND SUBSTRATE PROCESSING METHOD

(75) Inventors: Tomonori Kojimaru, Kyoto (JP); Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 12/179,154

(22) Filed: Jul. 24, 2008

(65) Prior Publication Data

US 2009/0032067 A1 Feb. 5, 2009

(30) Foreign Application Priority Data

Jul. 30, 2007 (JP) ................................. 2007-196992
Mar. 11, 2008 (JP) ................................. 2008-060514

(51) Int. Cl.
*B08B 3/04* (2006.01)

(52) U.S. Cl. ............... 134/26; 134/32; 134/33; 134/34; 134/36; 134/40; 134/41; 134/42; 134/148; 134/153

(58) Field of Classification Search ..................... 134/26, 134/32, 33, 34, 36, 40, 41, 42, 148, 153
See application file for complete search history.

(56) References Cited

U.S. PATENT DOCUMENTS

| | | | |
|---|---|---|---|
| 5,882,433 A | 3/1999 | Ueno | |
| 6,436,472 B1 * | 8/2002 | Sago et al. | 427/240 |
| 2002/0007844 A1 * | 1/2002 | Orii et al. | 134/30 |
| 2002/0053355 A1 * | 5/2002 | Kamikawa et al. | 134/30 |
| 2002/0062840 A1 * | 5/2002 | Verhaverbeke et al. | 134/1.3 |
| 2002/0197853 A1 * | 12/2002 | Nagai et al. | 438/639 |
| 2003/0196986 A1 * | 10/2003 | Tsung-Kuei et al. | 216/2 |
| 2004/0040584 A1 | 3/2004 | Miya et al. | |
| 2005/0051195 A1 * | 3/2005 | Kamikawa | 134/25.1 |
| 2006/0099339 A1 | 5/2006 | Hashizume | |
| 2009/0032067 A1 * | 2/2009 | Kojimaru et al. | 134/26 |

FOREIGN PATENT DOCUMENTS

| | | |
|---|---|---|
| CN | 1773670 A | 5/2006 |
| JP | 3-209715 | 9/1991 |

(Continued)

OTHER PUBLICATIONS

Office Action issued Nov. 24, 2009 in related U.S. Appl. No. 11/767,902, which includes, at pp. 9-10, a provisional obviousness-type double patenting rejection over certain claims of the present application.

*Primary Examiner* — Sharidan Carrillo
(74) *Attorney, Agent, or Firm* — Ostrolenk Faber LLP

(57) ABSTRACT

After the rinsing processing is completed, the rotation speed of the substrate is reduced from 600 rpm to 10 rpm to form a puddle-like DIW liquid film. After the supply of DIW is stopped, the control unit waits for a predetermined time (0.5 seconds) so that the film thickness t1 of the puddle-like liquid film becomes approximately uniform. Then, IPA is discharged to a central part of the surface of the substrate at a flow rate of 100 (mL/min) for instance. By the supply of IPA, DIW is replaced with IPA at the central part of the surface of the substrate to form a replaced region. Further, after three seconds of IPA supply, the rotation speed of the substrate is accelerated from 10 rpm to 300 rpm. This causes the replaced region to expand in a radial direction of the substrate so that the entire surface of the substrate is replaced with the low surface-tension solvent.

4 Claims, 9 Drawing Sheets

FOREIGN PATENT DOCUMENTS

| | | |
|---|---|---|
| JP | 9-38595 | 2/1997 |
| JP | 2003-092280 | 3/2003 |
| JP | 2003-92280 | 3/2003 |
| JP | 2004-146784 | 5/2004 |
| JP | 2006-32637 | 2/2006 |
| JP | 2006-108349 | 4/2006 |

* cited by examiner

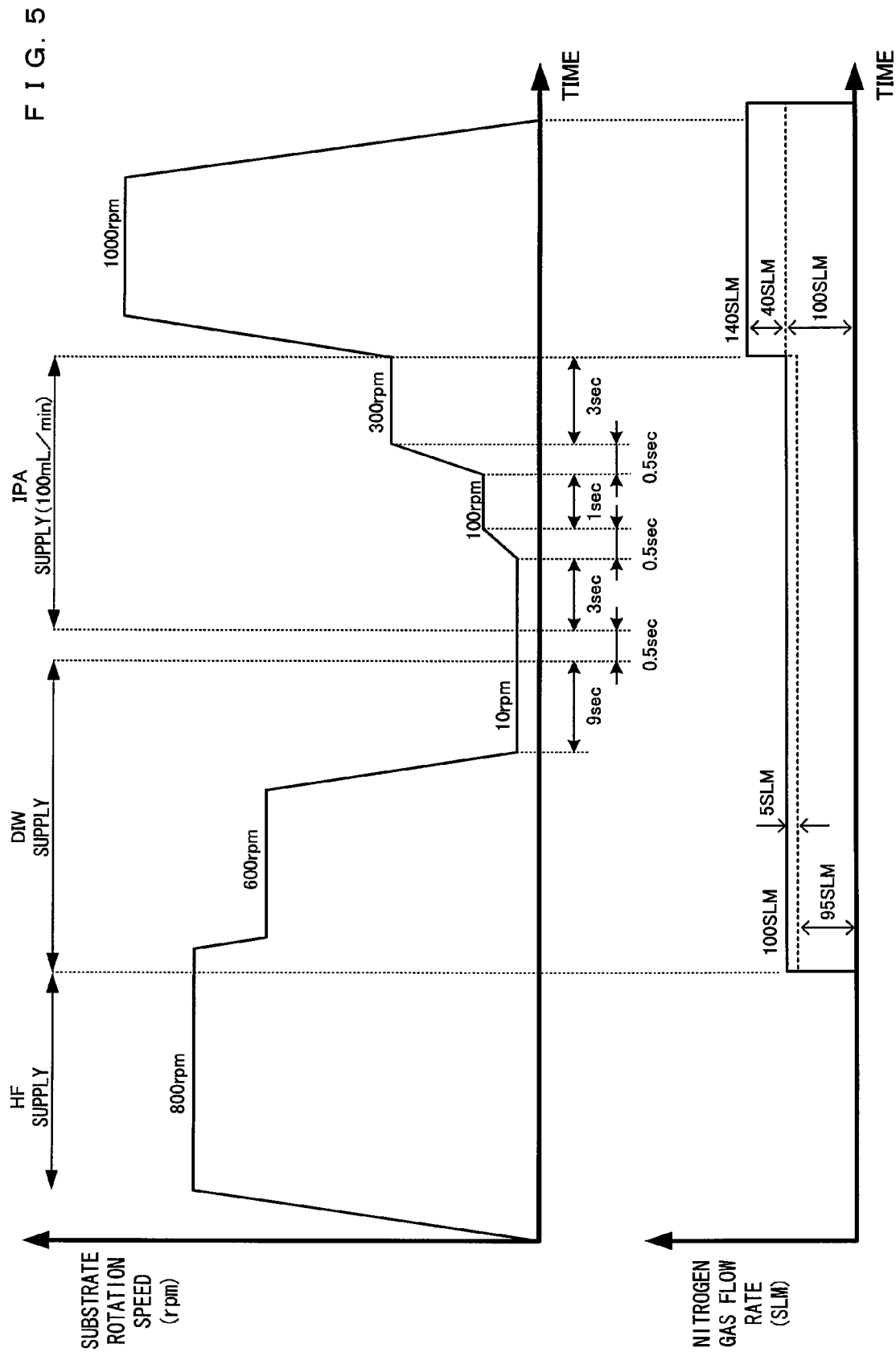

FIG. 6A : RINSING PROCESSING
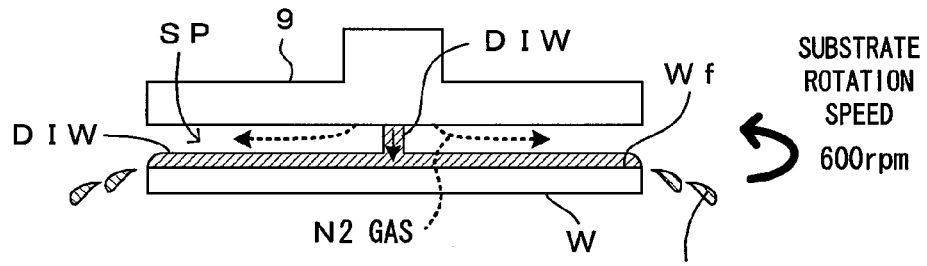
FIG. 6B : PUDDLE FORMING PROCESSING
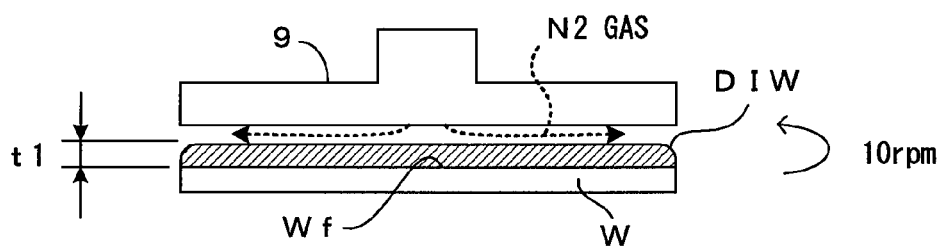
FIG. 6C : REPLACEMENT REGION FORMING PROCESSING
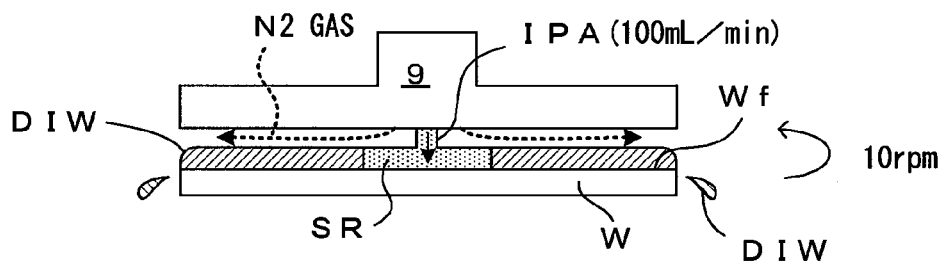
FIG. 6D : FIRST REPLACING PROCESSING
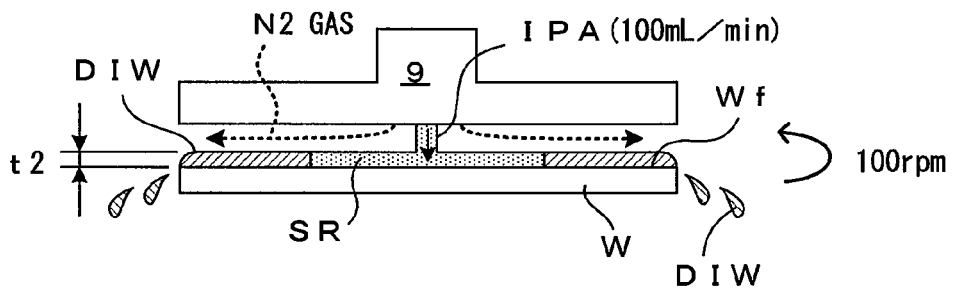
FIG. 6E : SECOND REPLACING PROCESSING
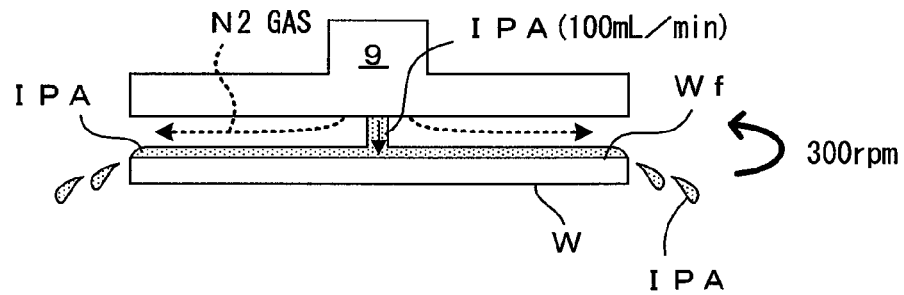

F I G. 7 A : ROTATION AT LOW SPEED (10rpm)
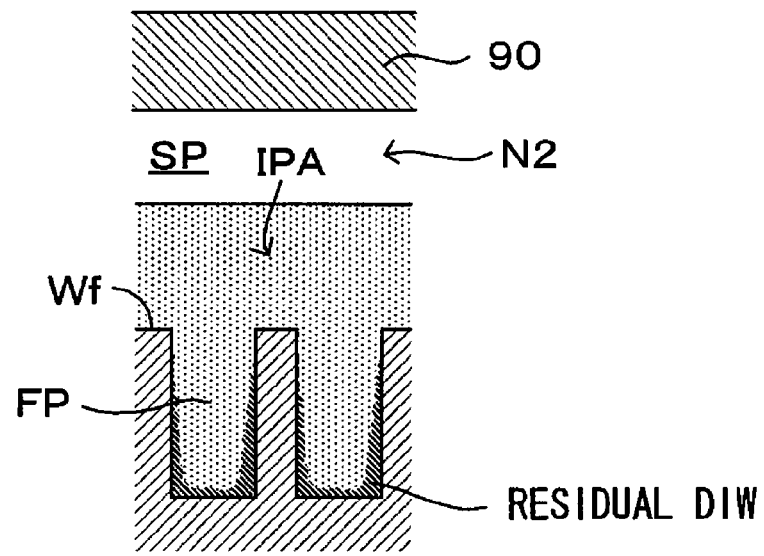
F I G. 7 B : ROTATION AT MEDIUM SPEED (300rpm)
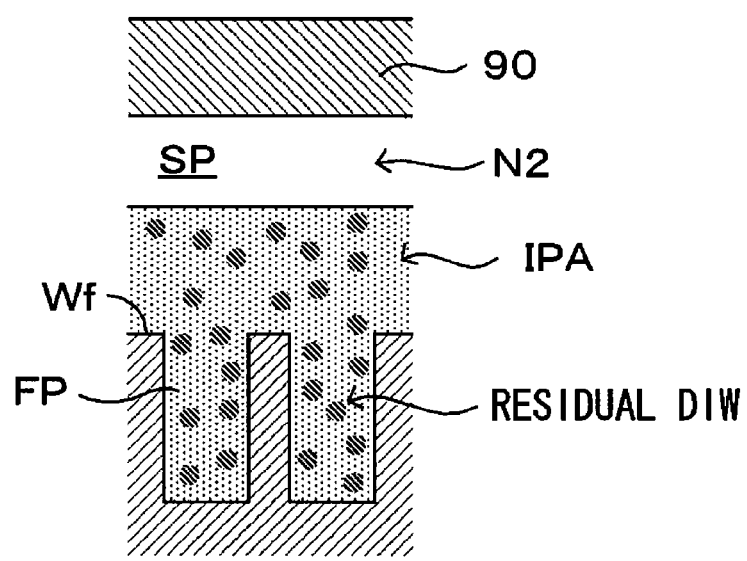

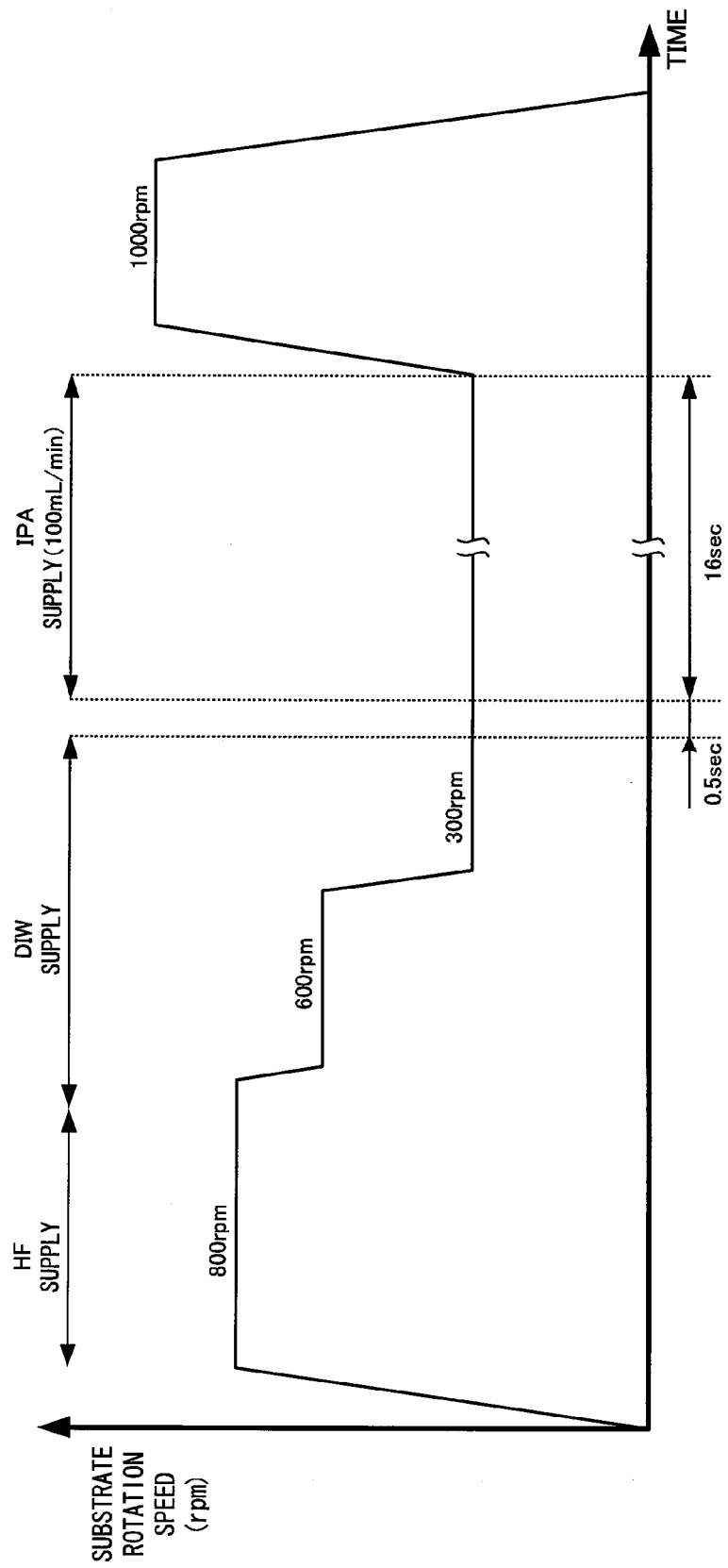

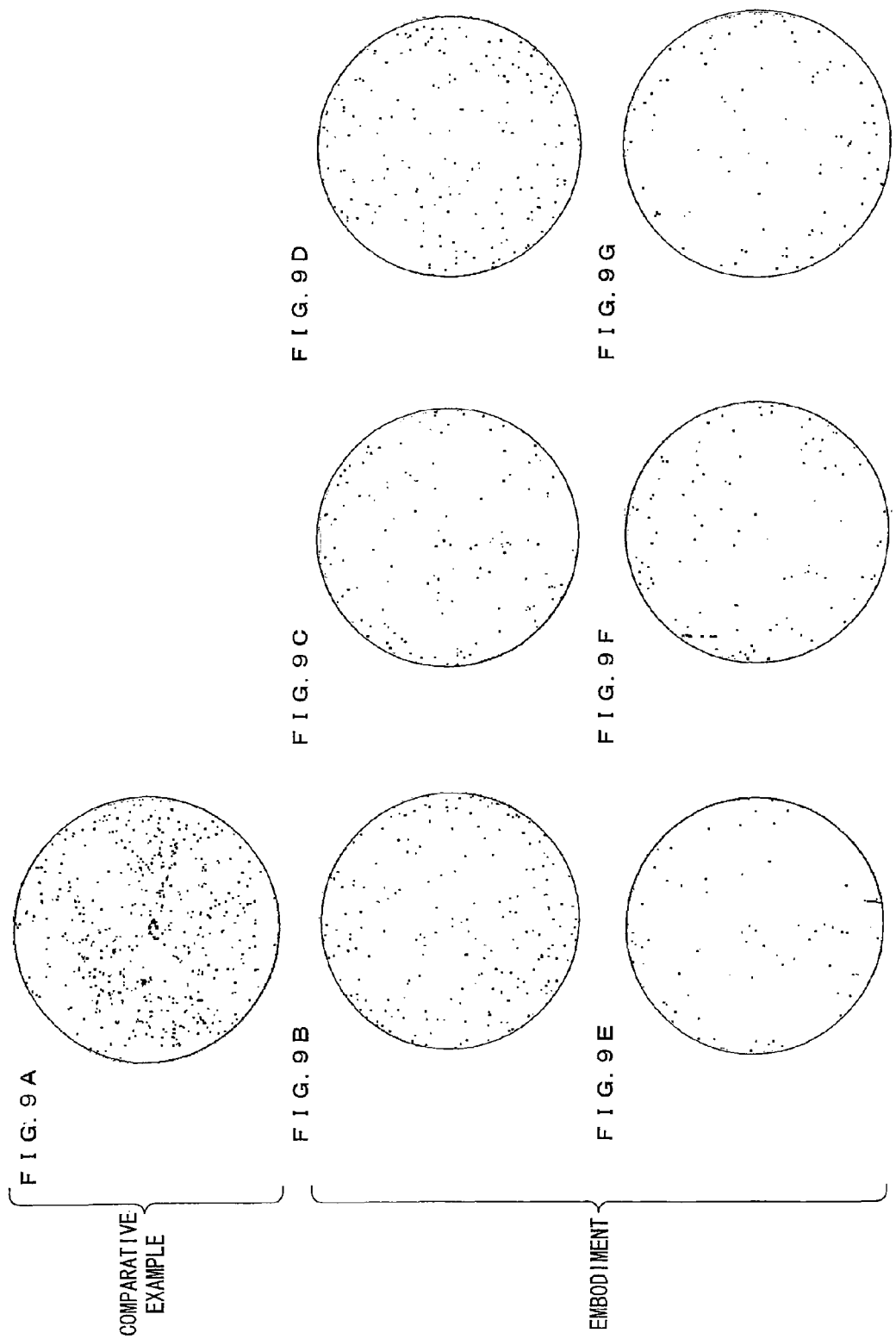

FIG. 10A : PARTIAL MIXTURE OF LOW SURFACE TENSION SOLVENT
PRIOR ART
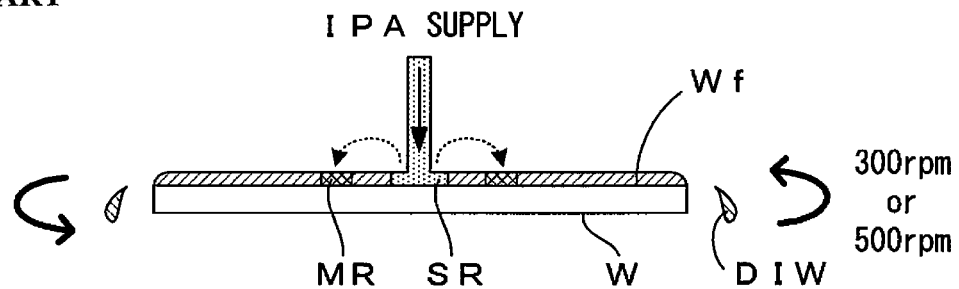
FIG. 10B : FORMATION OF PARTIALLY DRIED PORTION
BY MARANGONI CONVECTION
PRIOR ART
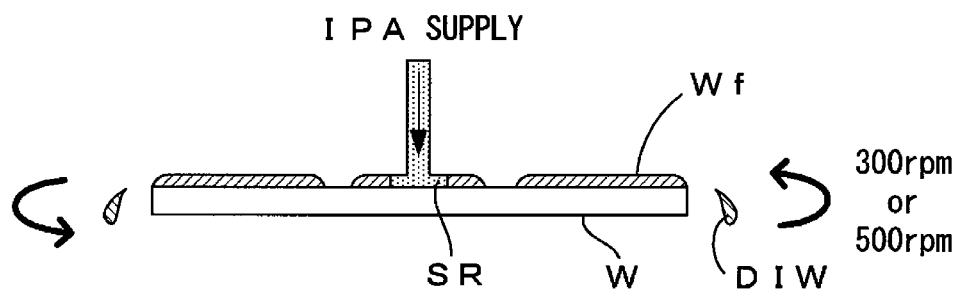

SUBSTRATE PROCESSING APPARATUS AND SUBSTRATE PROCESSING METHOD

CROSS REFERENCE TO RELATED APPLICATION

The disclosure of Japanese Patent Applications No. 2007-196992 filed on Jul. 30, 2007 and No. 2008-060514 filed on Mar. 11, 2008 including specification, drawings and claims is incorporated herein by reference in its entirety.

BACKGROUND OF THE INVENTION

1. Field of the Invention

The present invention relates to a substrate processing apparatus and a substrate processing method for applying a predetermined wet processing to a substrate surface by supplying a processing liquid to the substrate surface, and then, drying the substrate surface wet with the processing liquid. Substrates to be dried include semiconductor wafers, glass substrates for photomasks, glass substrates for liquid crystal displays, glass substrates for plasma displays, substrates for FEDs (field emission displays), substrates for optical discs, substrates for magnetic discs, and substrates for magnet-optical discs.

2. Description of the Related Art

Numerous drying methods have already been proposed which aim at removal of a rinsing liquid adhering to a substrate surface after chemical processing using a chemical solution and rinsing processing using a rinsing liquid which may be pure water or the like. Known as one such method is a drying method which uses a liquid (low surface-tension solvent) including an organic solvent component whose surface tension is lower than pure water such as IPA (isopropyl alcohol). There is a drying method described in JP-A-9-38595 for instance as such a drying method. In a substrate processing apparatus which executes this drying method, after hydrofluoric acid treatment of a substrate surface, pure water is supplied to the substrate surface to perform cleaning processing (rinsing processing). Following this, IPA is supplied to the substrate surface without any break after the end of the supply of pure water or from the middle of the supply of pure water. In consequence, IPA is dissolved in pure water which is present on the substrate surface, and replaces pure water. The substrate is rotated at a high speed thereafter, which removes IPA from the substrate surface and the substrate surface is dried.

Further, according to a resist developing method described in JP-A-3-209715, the substrate surface is dried while the amount of micro foreign matters present on the substrate surface is reduced in the following manner. First, pure water is supplied to the substrate after development of a resist, thereby performing pure water cleaning (rinsing processing). After this, pure water containing IPA at the capacity ratio of about 10% (IPA solution) is supplied to the substrate, whereby the substrate is cleaned. This is followed by spin drying of the substrate while rotating the substrate at a high speed.

SUMMARY OF THE INVENTION

By the way, according to the related technology described above, the rinsing processing is performed by supplying the rinsing liquid to the surface of the substrate while the substrate is rotated at a medium speed (300 rpm in JP-A-9-38595 and 500 rpm in JP-A-3-209715, for instance). Further, in the replacing processing which follows the rinsing processing, low surface-tension solvent such as IPA, IPA solvent and the like is supplied in large amount to the substrate surface while maintaining the rotation speed of the substrate to replace the rinsing liquid on the substrate with the low surface-tension solvent in a short time. Accordingly, in the related technology, there occurs a problem that the used amount of low surface-tension solvent is relatively large, which increases a running cost. Consequently, reducing flow rate of low surface-tension solvent is considered in order to decrease the used amount of the low surface-tension solvent.

However, when the flow rate of low surface-tension solvent is reduced, replacing with the low surface-tension solvent progresses very slowly, which leads to a case that the substrate surface partially dries due to Marangoni convection. This is briefly described with reference to FIGS. 10A and 10B. At an early stage after the supply of the low surface-tension solvent such as IPA is started, the low surface-tension solvent such as IPA is supplied to the central portion of the surface of the substrate W so that a replaced region SR replaced with the low surface-tension solvent is formed as shown in FIG. 10A. At this time, some of the low surface-tension solvent may bounce off the substrate surface Wf to splash to the area surrounding the replaced region SR, or vaporized low surface-tension solvent component may disperse to the area surrounding the replaced region SR. Hence, the low surface-tension solvent may get mixed into the rinsing liquid surrounding the replaced region. According to the related technology mentioned-above in particular, the rotation speed of the substrate W is maintained at a medium speed as described above. Hence, a thickness of the liquid film is relatively thin. Consequently, the concentration of the low surface-tension solvent in a mixed part MR of the liquid film mixed with the low surface-tension solvent is increased. As a result, there occurred that the substrate surface Wf is partly dried due to the generation of Marangoni convection in the mixed part MR as shown in FIG. 10B, leading to a trouble such as the generation of watermarks.

The invention has been made in light of the problem described above. An object of the invention is to dry the substrate surface excellently with a little amount of the low surface-tension solvent in the substrate processing apparatus and the substrate processing method which dry the substrate surface wet with the processing liquid using the low surface-tension solvent such as IPA.

According to a first aspect of the invention, there is provided a substrate processing method comprising: a wet processing step of performing a wet processing to a surface of a substrate using a processing liquid while rotating the substrate in a substantially horizontal state at a first speed; a puddle forming step of forming a puddle-like liquid film of the processing liquid on the substrate by reducing the rotation speed of the substrate to a second speed slower than the first speed; a replaced-region forming step of forming a replaced region by supplying a low surface-tension solvent whose surface tension is lower than that of the processing liquid to a central part of the substrate surface while maintaining the rotation speed of the substrate at a speed not more than the second speed, the replaced region being formed by replacing the processing liquid with the low surface-tension solvent; a replacing step of replacing the liquid film of the entire substrate surface with the low surface-tension solvent by supplying the low surface-tension solvent to the central part of the substrate surface to expand the replaced region in a radial direction of the substrate; and a drying step of drying the substrate surface by removing the low surface-tension solvent from the substrate surface after the replacing step.

According to a second aspect of the invention, there is provided a substrate processing apparatus comprising: a substrate holder that holds a substrate in a substantially horizontal posture; a wet processing device that performs a wet processing to a surface of the substrate held by the substrate holder using a processing liquid; a substrate rotating device that rotates the substrate held by the substrate holder about a predetermined rotation axis; a supplier that supplies a low surface-tension solvent whose surface tension is lower than that of the processing liquid to a central part of the surface of the substrate held by the substrate holder; a rotating controller that controls the substrate rotating device to adjust a rotation speed of the substrate, sets the rotation speed of the substrate at a first speed while the wet processing is performed by the wet processing device, and reduces the rotation speed of the substrate to a second speed slower than the first speed prior to the supply of the low surface-tension solvent by the supplier to form a puddle-like liquid film of the processing liquid on the substrate; and a supplying controller that causes the supplier to supply the low surface-tension solvent to the substrate of which the rotation speed is kept not more than the second speed to form a replaced region at the central part of the surface of the substrate, the replaced region being formed by replacing the processing liquid with the low surface-tension solvent, and causes the supplier to continue to supply the low surface-tension solvent to the replaced region so as to expand the replaced region in a radial direction of the substrate to thereby replace the liquid film of the entire surface of the substrate with the low surface-tension solvent, wherein the surface of the substrate is dried by removing the low surface-tension solvent from the surface of the substrate after the liquid film of the entire surface of the substrate is replaced with the low surface-tension solvent.

According to a first and a second aspects of the invention, the substrate held in an approximately horizontal posture is rotated at a first speed and a wet processing such as rinsing processing is performed to a surface of the substrate using a processing liquid. Subsequently, the rotation speed of the substrate is reduced to a second speed slower than the first speed so that a puddle-like liquid film of the processing liquid is formed on the substrate. In this state, a low surface-tension solvent whose surface tension is lower than that of the processing liquid is supplied to a central part of the surface of the substrate to form a replaced region replaced with the low surface-tension solvent in the central part of the surface of the substrate (replaced-region forming step). Subsequently, the low surface-tension solvent is further supplied to the central part of the surface to expand the replaced region in a radial direction of the substrate so that the liquid film of the entire substrate surface is replaced with the low surface-tension solvent (replacing step). Then, the low surface-tension solvent is removed from the substrate surface and the substrate surface is dried. Thus, the liquid film of the entire substrate surface is replaced with the low surface-tension solvent while controlling the formation and the expansion of the replaced region. Hence, it is possible to reduce a used amount of the low surface-tension solvent compared to the related technology in which a large amount of low surface-tension solvent is supplied to the substrate surface to replace the liquid film of the entire substrate surface with the low surface-tension solvent at once.

Here, there exists a possibility that Marangoni convection is generated when the low surface-tension solvent is mixed into the area surrounding the replaced region at the time the replaced region is formed. However, since the rotation speed of the substrate is controlled as described above, the generation of Marangoni convection is suppressed. Specifically, according to a first and a second aspects of the invention, in order to form the puddle-like liquid film while rotating the substrate, the second speed (including zero) is set so that the centrifugal force acting on the processing liquid is less than the surface tension acting between the processing liquid and the substrate surface. Therefore, by maintaining the rotation speed of the substrate at a speed not more than the second speed, the liquid film on the substrate surface is thicker than that during the wet processing. Since the replaced region is formed in this state described above, the liquid film is thicker than that in the related technology mentioned-above. Hence, even if the low surface-tension solvent mixes into the area surrounding the replaced region, the generation of Marangoni convection at a mixed area is suppressed. As a result, the problem that the substrate surface is partially dried is effectively prevented.

Meanwhile, an organic solvent component of 100% or a liquid mixture of this and pure water (or DIW) may be used as the "low surface-tension solvent" of the invention. Further, as the low surface-tension solvent, a solvent which includes a surface acting agent as an essential component may be used instead of the solvent which includes an organic solvent component. At this stage, an alcoholic organic solvent may be used as the "organic solvent component". While isopropyl alcohol, ethyl alcohol or methyl alcohol may be used in consideration of the safety, the price and the like, isopropyl alcohol (IPA) is particularly suitable.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 5 is a timing chart showing the operation of the substrate processing apparatus of FIG. 1.

FIGS. 6A to 6E, 7A and 7B are diagrams schematically showing the operation of the substrate processing apparatus of FIG. 1.

FIG. 8 is a timing chart showing a substrate processing method according to a comparative example.

FIGS. 9A to 9G are views showing distribution of particles on the substrate surface processed as a comparative example and as working examples of the invention.

FIGS. 10A and 10B are schematic diagrams showing an operation of a substrate processing apparatus of a related art.

DETAILED DESCRIPTION OF THE PREFERRED EMBODIMENTS

Figure 1:
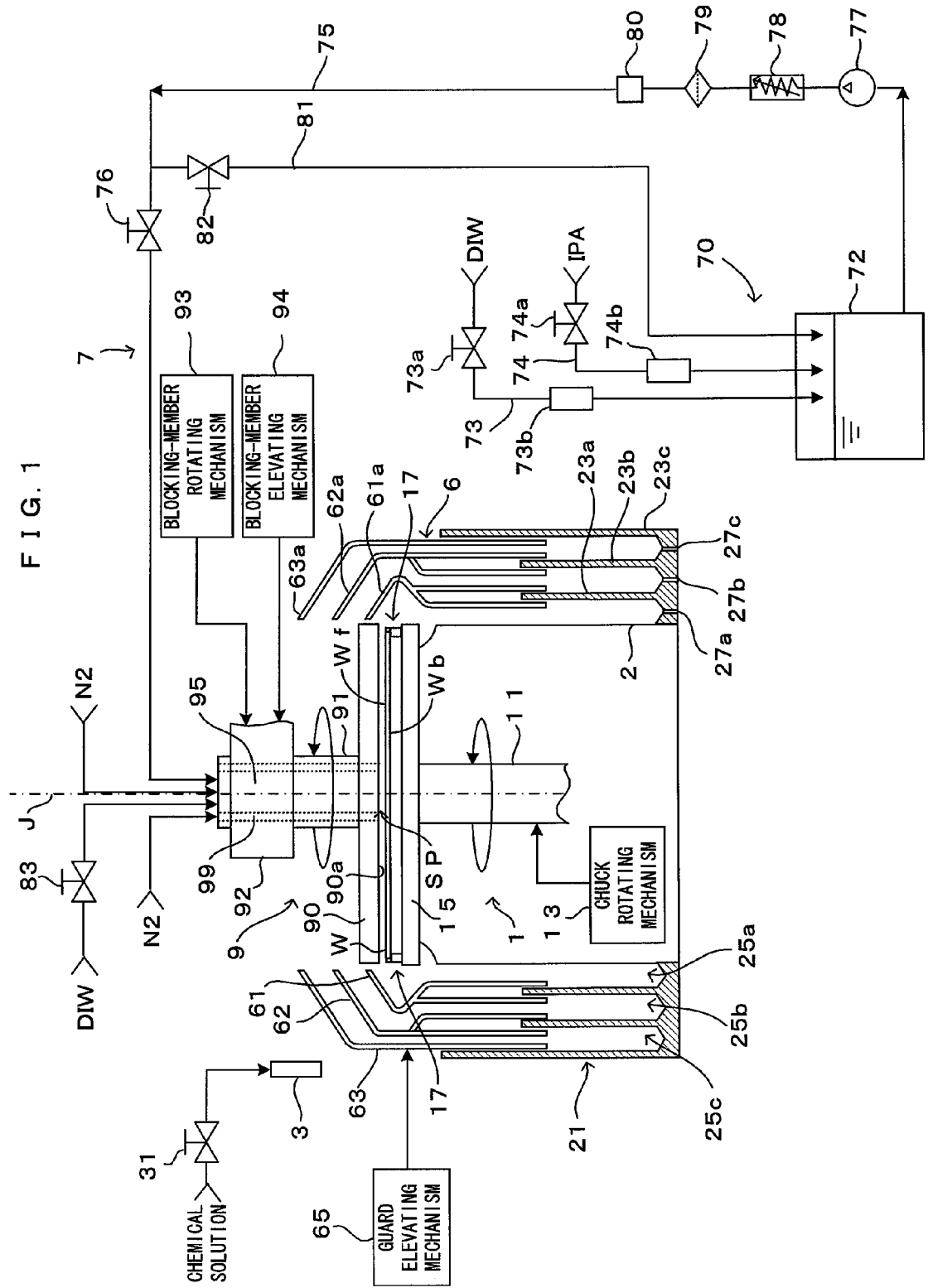
FIG. 1 is a diagram showing an embodiment of a substrate processing apparatus according to this invention.
Figure 2:
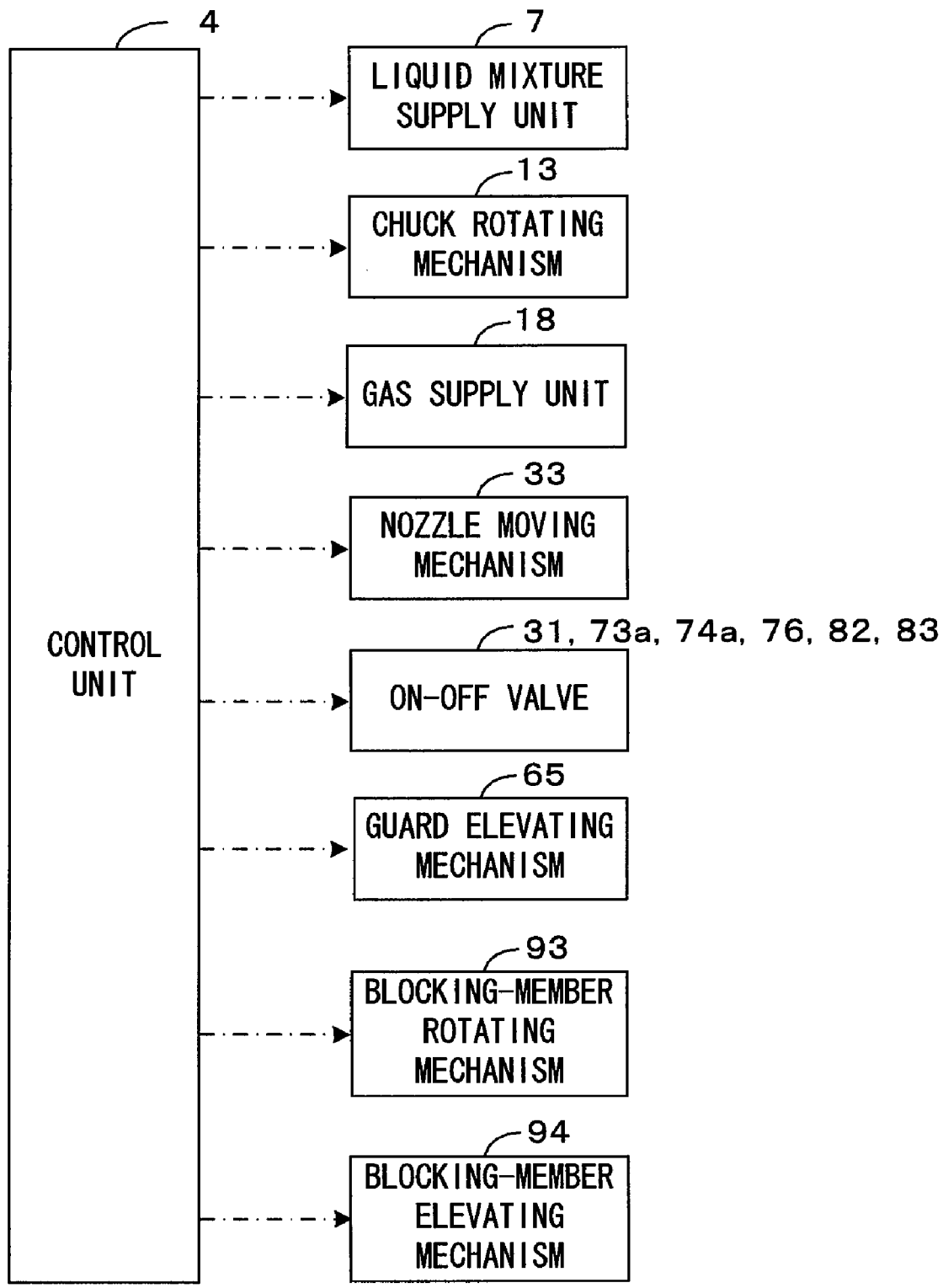
FIG. 2 is a block diagram showing a main control construction of the substrate processing apparatus of FIG. 1.

FIG. 1 is a diagram showing an embodiment of a substrate processing apparatus according to this invention, and FIG. 2 is a block diagram showing a main control construction of the substrate processing apparatus of FIG. 1. This substrate processing apparatus is a substrate processing apparatus of a single wafer type used for cleaning processing to remove undesired substance adhering to a surface Wf of a substrate W such as a semiconductor wafer. More specifically, this apparatus dries the substrate surface Wf wet with a rinsing liquid after applying chemical processing using a chemical solution such as a hydrofluoric acid and rinsing processing using the rinsing liquid such as pure water or DIW (deionized water) to the substrate surface Wf. In this embodiment, the substrate surface Wf means a pattern-formed surface on which a device pattern made of poly-Si or the like is formed.

This substrate processing apparatus includes a spin chuck 1, a chemical solution discharging nozzle 3, and a blocking member 9. The spin chuck 1 holds the substrate W in a substantially horizontal posture with the substrate surface Wf faced up and rotates the substrate W. The chemical solution discharging nozzle 3 discharges a chemical solution toward the surface Wf of the substrate W held by the spin chuck 1. The blocking member 9 is disposed at a position above the spin chuck 1.

The spin chuck 1 has a rotary spindle 11 linked to a rotary shaft of a chuck rotating mechanism 13 including a motor, and is rotatable about a rotation axis J (vertical axis) by driving the chuck rotating mechanism 13. The rotary spindle 11 and the chuck rotating mechanism 13 are housed in a cylindrical casing 2. A disk-shaped spin base 15 is integrally connected to the upper end of the rotary spindle 11 by means of a fastening part such as a screw. Accordingly, the spin base 15 rotates about the rotation axis J by driving the chuck rotating mechanism 13 in accordance with an operation command from a control unit 4 which controls the entire apparatus. Thus, in this embodiment, the chuck rotating mechanism 13 functions as a "substrate rotating unit" of the invention. The control unit 4 controls the chuck rotating mechanism 13 to adjust a rotation speed thereof.

Plural chuck pins 17 for holding the substrate W at the rim thereof are disposed upright in the vicinity of the rim of the spin base 15. There may be three or more chuck pins 17 to securely hold the disk-shaped substrate W, and the chuck pins 17 are arranged at equal angular intervals along the rim of the spin base 15. Each chuck pin 17 comprises a substrate support part which supports the substrate W at the rim thereof from below and a substrate holding part which presses the substrate W at the outer peripheral edge surface thereof to hold the substrate W. Each chuck pin 17 is structured so as to be capable of switching between a pressing state that the substrate holding part presses the substrate W at the outer peripheral edge surface thereof and a released state that the substrate holding part stays away from the outer peripheral edge surface of the substrate W.

The plural chuck pins 17 are in the released state while the substrate W is being transferred to the spin base 15 but in the pressing state for cleaning of the substrate W. When in the pressing state, the plural chuck pins 17 hold the substrate W at the rim thereof and keep the substrate approximately horizontally at a predetermined distance from the spin base 15. The substrate W is held with its front surface (pattern-formed surface) Wf directed toward above and its rear surface Wb toward below. Thus, in this embodiment, the chuck pins 17 function as a "substrate holder" of the invention. Meanwhile, the substrate holder is not limited to the chuck pins 17. A vacuum chuck which holds the substrate W by vacuuming the substrate rear surface Wb may be used as the substrate holder.

The chemical solution discharging nozzle 3 is connected with a chemical solution supplying source via a chemical solution valve 31. Hence, when the chemical solution valve 31 opens or closes based on a control command from the control unit 4, the chemical solution is pressure-fed from the chemical solution supplying source toward the chemical solution discharging nozzle 3, and the chemical solution discharging nozzle 3 discharges the chemical solution. Meanwhile, hydrofluoric acid, BHF (buffered hydrogen fluoride), or the like is used as the chemical solution. Further, the chemical solution discharging nozzle 3 is connected with a nozzle moving mechanism 33 (FIG. 2). The nozzle moving mechanism 33 is driven in response to an operation command from the control unit 4, hence, the chemical solution discharging nozzle 3 reciprocally moves between a discharge position which is above the center of rotation of the substrate W and a stand-by position which is off the discharge position to the side.

The blocking member 9 includes a plate-like member 90, a rotary spindle 91 which is hollow inside and supports the plate-like member 90, and an inner inserted shaft 95 which is inserted in a hollow part of the rotary spindle 91. The plate-like member 90 is a disk-shaped member having an aperture in the center, and opposed to the surface Wf of the substrate W held by the spin chuck 1. A lower surface (bottom surface) 90a of the plate-like member 90 serves as a substrate facing surface which faces the substrate surface Wf substantially in parallel, and is formed to have a planar size equal to or larger than the diameter of the substrate W. The plate-like member 90 is substantially horizontally mounted on the bottom end of the rotary spindle 91 having a substantially cylindrical shape, and the rotary spindle 91 is so held by a horizontally extending arm 92 as to be rotatable about the rotation axis J passing the center of the substrate W. A bearing (not shown) is mounted between the outer circumferential surface of the inner inserted shaft 95 and the inner circumferential surface of the rotary spindle 91. A blocking-member rotating mechanism 93 and a blocking-member elevating mechanism 94 are connected with the arm 92.

The blocking-member rotating mechanism 93 rotates the rotary spindle 91 about the rotation axis J in accordance with an operation command from the control unit 4. When the rotary spindle 91 is rotated, the plate-like member 90 integrally rotates with the rotary spindle 91. The blocking-member rotating mechanism 93 is constructed to rotate the plate-like member 90 (lower surface 90a) in the same direction and substantially at the same speed as the substrate W as the substrate W held by the spin chuck 1 rotates.

The blocking-member elevating mechanism 94 moves the blocking member 9 close and opposed to the spin base 15 and, conversely, moves the blocking member 9 away from the spin base 15 in accordance with an operation command from the control unit 4. Specifically, by activating the blocking-member elevating mechanism 94, the control unit 4 causes the blocking member 9 to move up to a separated position above the spin chuck 1 upon loading and unloading the substrate W into and from the substrate processing apparatus. On the other hand, the control unit 4 causes the blocking member 9 to move down to a predetermined facing position (position shown in FIG. 1) set right in the vicinity of the surface Wf of the substrate W held by the spin chuck 1 upon applying predetermined processing to the substrate W. In this embodiment, the blocking member 9 is lowered from the separated position to the facing position after the start of the rinsing processing and kept at the facing position until the drying processing is completed.

Figure 3:
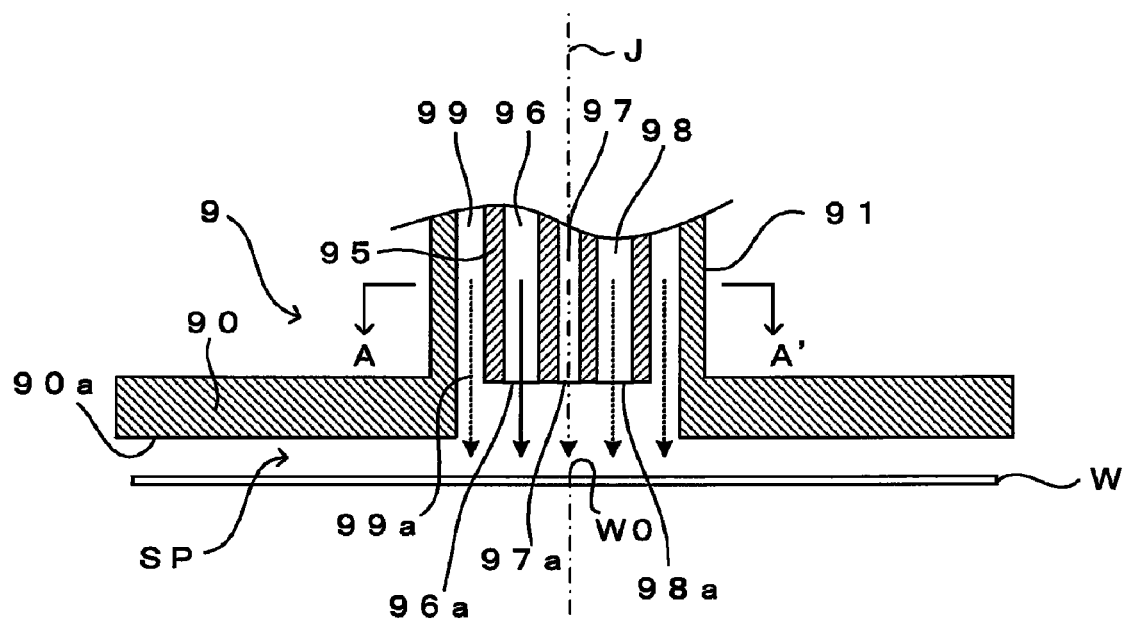
FIG. 3 is a vertical sectional view showing an essential portion of a blocking member equipped in the substrate processing apparatus of FIG. 1.
Figure 4:
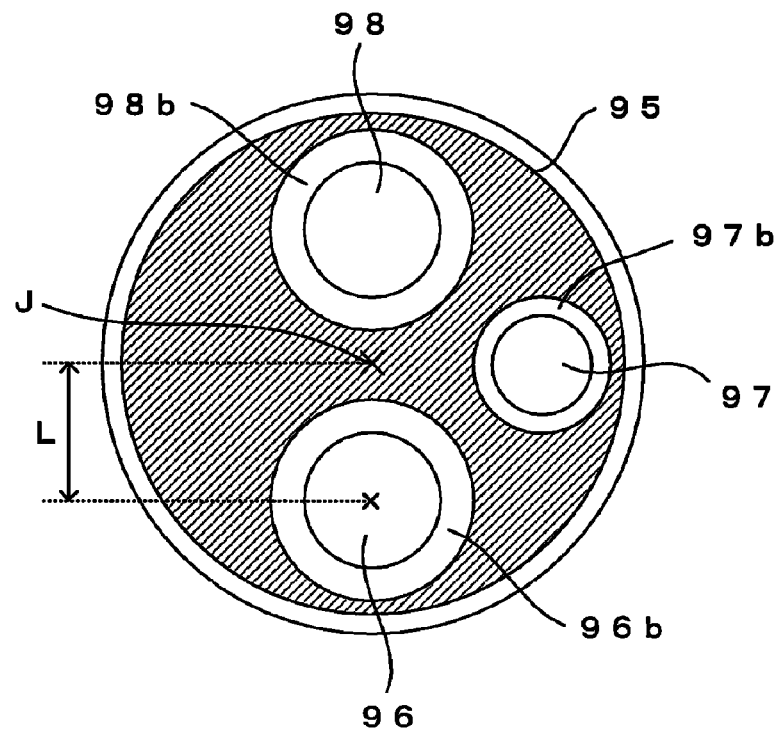
FIG. 4 is a sectional view (horizontal sectional view) taken on line A-A of FIG. 3.

FIG. 3 is a vertical sectional view showing an essential portion of a blocking member equipped in the substrate processing apparatus of FIG. 1, and FIG. 4 is a sectional view (horizontal sectional view) taken on line A-A of FIG. 3. The inner inserted shaft 95 inserted in the hollow part of the rotary spindle 91 has a circular horizontal section. This is for equally holding a clearance between the inner inserted shaft (non-rotary member) 95 and the rotary spindle (rotary member) 91 over the entire circumference, and the clearance between the inner inserted shaft 95 and the rotary spindle 91 is sealed from the outside by introducing a sealing gas thereinto. The inner inserted shaft 95 is formed with three fluid supply passages extending in a vertical direction. Specifically, a rinsing liquid supply passage 96, a solvent supply passage 97, and a gas supply passage 98 are formed in the inner inserted shaft 95. The rinsing liquid supply passage 96 is a passage for the rinsing liquid. The solvent supply passage 97 is a passage for a low surface-tension solvent having an organic solvent component which is dissolved in the rinsing liquid to lower the surface tension. The gas supply passage 98 is a passage for an inert gas such as a nitrogen gas. The rinsing liquid supply passage 96, the solvent supply passage 97 and the gas supply passage 98 are formed by respectively inserting tubes 96b, 97b and 98b made of PFA (polymer of tetrafluoroethylene and perfluoroalkylvinylether) into the inner inserted shaft 95 made of PTFE (polytetrafluoroethylene).

The bottom ends of the rinsing liquid supply passage 96, the solvent supply passage 97 and the gas supply passage 98 respectively serve as a rinsing liquid discharge port 96a, a solvent discharge port 97a and a gas discharge port 98a, and face the surface Wf of the substrate W held by the spin chuck 1. In this embodiment, the diameter of the inner inserted shaft is 18 to 20 mm. The bore diameters of the rinsing liquid discharge port 96a, the solvent discharge port 97a and the gas discharge port 98a are 4 mm, 1 to 2 mm and 4 mm, respectively. In this way, the bore diameter of the solvent discharge port 97a is smaller than that of the rinsing liquid discharge port 96a in this embodiment. This can prevent the following problems. Specifically, the low surface-tension solvent has a lower surface tension than the rinsing liquid (DIW). Thus, if the low surface-tension solvent is discharged through a solvent discharge port having the same bore diameter as the rinsing liquid discharge port, there is a likelihood that the low surface-tension solvent drops from the solvent discharge port after the discharge of the low surface-tension solvent is stopped. On the other hand, if the rinsing liquid is discharged through a rinsing liquid discharge port having the same bore diameter as a solvent discharge port, the discharge speed of the rinsing liquid is too fast. As a result, the rinsing liquid (DIW) that is an electrical insulator collides with the substrate surface Wf at a relatively high speed, thereby making it possible that supplied parts of the substrate surface Wf to which the rinsing liquid is directly supplied are charged and oxidized. Contrary to this, in this embodiment, separate discharge ports are provided for the low surface-tension solvent and the rinsing liquid, and the bore diameter of the solvent discharge port 97a is smaller than that of the rinsing liquid discharge port 96a. Thus, the low surface-tension solvent is prevented from dropping from the solvent discharge port and an increase in the discharge speed of the rinsing liquid from the rinsing liquid discharge port is suppressed, whereby the oxidization of the substrate surface Wf caused by charging can be suppressed.

Further, in this embodiment, the rinsing liquid discharge port 96a is provided at a position displaced from the central axis of the blocking member 9, that is, at a position displaced radially outward from the rotation axis J of the substrate W. This can avoid the rinsing liquid discharged from the rinsing liquid discharge port 96a being supplied in such a manner as to concentrate on one point of the substrate surface Wf (rotation center W0 of the substrate W). As a result, charged parts of the substrate surface Wf can be scattered and the oxidation of the substrate W caused by charging can be reduced. On the other hand, if the rinsing liquid discharge port 96a is excessively distanced from the rotation axis J, it becomes difficult for the rinsing liquid to reach the rotation center W0 of the substrate surface Wf. Accordingly, in this embodiment, the distance L from the rotation axis J to the rinsing liquid discharge port 96a (discharge port center) in a horizontal direction is set about 4 mm. Here, an upper limit of the distance L at which the rinsing liquid (DIW) can be supplied to the rotation center W0 of the substrate surface Wf is 20 mm under the following conditions.

Flow rate of DIW: 2 L/min
Number of revolutions of substrate: 1500 rpm
State of substrate surface: central part of the surface is a hydrophobic surface Further, an upper limit of distance from the rotation axis J to the solvent discharge port 97a (discharge port center) is basically the same as the upper limit (20 mm) of the distance L from the rotation axis J to the rinsing liquid discharge port 96a (discharge port center) described above as long as the number of revolutions of the substrate is set at 1500 rpm.

On the other hand, distance from the rotation axis J to the gas discharge port 98a (discharge port center) can be arbitrarily set without being particularly limited as long as a nitrogen gas can be supplied into a clearance space SP defined between the blocking member 9 (plate-like member 90) positioned at the facing position and the substrate surface Wf. However, the gas discharge port 98a is preferably provided on the rotation axis J or at a position proximate thereto from the standpoint of blowing the nitrogen gas to a solvent layer of the low surface-tension solvent formed on the substrate surface Wf to remove the solvent layer from the substrate W as described later.

Further, a space portion defined between the inner wall surface of the rotary spindle 91 and the outer wall surface of the inner inserted shaft 95 forms an outer gas supply passage 99, the bottom end of which serves as an annular outer gas discharge port 99a. In other words, the blocking member 9 is formed with the outer gas discharge port 99a in addition to the gas discharge port 98a for discharging the nitrogen gas toward the central part of the substrate surface Wf, the outer gas discharge port 99a being located radially outward of the rinsing liquid discharge port 96a, the solvent discharge port 97a and the gas discharge port 98a and surrounding the rinsing liquid discharge port 96a, the solvent discharge port 97a and the gas discharge port 98a. The aperture area of this outer gas discharge port 99a is formed considerably larger than that of the gas discharge port 98a. Since the blocking member 9 is provided with two kinds of gas discharge ports in this way, the nitrogen gas can be discharged at different flow rates and flow velocities from the respective discharge ports. For example, (1) it is preferable to supply the nitrogen gas at a relatively large flow rate and a low flow velocity so as not to blow the liquid on the substrate surface Wf in order to maintain an inert gas atmosphere as the ambient atmosphere of the substrate surface Wf. On the other hand, (2) it is preferable to supply the nitrogen gas at a relatively small flow rate and a high flow velocity to the central part of the surface of the substrate W upon removing the solvent layer of the low surface-tension solvent formed on the substrate surface Wf from the substrate surface Wf. Accordingly, the nitrogen gas is mainly discharged from the outer gas discharge port 99a in the case (1) and the nitrogen gas is mainly discharged from the gas discharge port 98a in the case (2), whereby the nitrogen gas can be supplied toward the substrate surface Wf at suitable flow rate and flow velocity depending on the usage of the nitrogen gas.

Further, the leading end (bottom end) of the inner inserted shaft 95 is not flush with the lower surface 90a of the plate-like member 90, and is retracted upward from the same plane including the lower surface 90a (FIG. 3). According to such a construction, the nitrogen gas discharged from the gas discharge port 98a can be diffused to decrease the flow velocity thereof to a certain degree by the time the nitrogen gas reaches the substrate surface Wf. Specifically, if the flow velocity of the nitrogen gas from the gas discharge port 98a is too fast, it interferes with the nitrogen gas from the outer gas discharge port 99a, making it difficult to remove the solvent layer of the low surface-tension solvent on the substrate surface Wf from the substrate W. As a result, liquid drops remain on the substrate surface Wf. Contrary to this, according to the above construction, the flow velocity of the nitrogen gas from the gas discharge port 98a can be moderated to reliably remove the solvent layer of the low surface-tension solvent on the substrate surface Wf from the substrate W.

Referring back to FIG. 1, description continues. The upper end of the rinsing liquid supply passage 96 is connected to a DIW supplying source formed by utilities of a plant and the like via a rinsing liquid valve 83, and DIW can be discharged as a rinsing liquid from the rinsing liquid discharge port 96a by opening the rinsing liquid valve 83.

The upper end of the solvent supply passage 97 is connected to a solvent supply unit 7. The solvent supply unit 7 is provided with a cabinet part 70 for producing low surface-tension solvent and is capable of pressure-feeding the low surface-tension solvent produced in the cabinet part 70 to the solvent supply passage 97. As the organic solvent component, the substance which is soluble in DIW (whose surface tension is 72 mN/m) to reduce the surface tension, isopropyl alcohol (surface tension: 21 to 23 mN/m) for instance, is used. The organic solvent component is not limited to the isopropyl alcohol, but also various kinds of organic solvent components such as ethyl alcohol and methyl alcohol may be used. Further, the organic solvent component is not limited to liquid. Vapor of various alcohol may be dissolved in the DIW as the organic solvent component to produce the low surface-tension solvent.

The cabinet part 70 comprises a reservoir tank 72 which holds the low surface-tension solvent. The reservoir tank 72 accepts one end of a DIW introducing pipe 73 which is for supplying DIW into inside the reservoir tank 72, and the other end of the DIW introducing pipe 73 is connected via an on-off valve 73a with the DIW supplying source. Further, a flowmeter 73b is inserted in the DIW introducing pipe 73 and measures the flow rate of DIW which is led to the reservoir tank 72 from the DIW supplying source. Based on the flow rate which the flowmeter 73b measures, the control unit 4 controls opening and closing of the on-off valve 73a so that the flow rate of DIW flowing in the DIW introducing pipe 73 would be a target flow rate (target value).

In a similar manner, the reservoir tank 72 accepts one end of an IPA introducing pipe 74 which is for supplying the IPA liquid into inside the reservoir tank 72, and the other end of the IPA introducing pipe 74 is connected via an on-off valve 74a with an IPA supplying source. Further, a flowmeter 74b is inserted in midstream of the IPA introducing pipe 74 and measures the flow rate of the IPA liquid which is led to the reservoir tank 72 from the IPA supplying source. Based on the flow rate which the flowmeter 74b measures, the control unit 4 controls opening and closing of the on-off valve 74a so that the flow rate of the IPA liquid flowing in the IPA introducing pipe 74 would be a target flow rate (target value).

In this embodiment, a volume percentage of IPA in the low surface-tension solvent (hereinafter called "IPA concentration") is adjustable. That is, it is possible either to supply 100% IPA as the low surface-tension solvent or to supply a liquid mixture of IPA and DIW as the low surface-tension solvent. In the case where 100% IPA is always used as the low surface-tension solvent, it may be arranged that IPA is directly supplied through a solvent valve 76 which is to be described next.

One end of a solvent supply pipe 75 is connected to the solvent supply passage 97 and the other end of the solvent supply pipe 75 is inserted into the reservoir tank 72. It is structured to be capable of supplying the low surface-tension solvent stored in the reservoir tank 72 to the solvent supply passage 97 via the solvent valve 76. The solvent supply pipe 75 is provided with a constant rate pump 77 for pumping out the low surface-tension solvent stored in the reservoir tank 72 to the solvent supply pipe 75, a temperature regulator 78 for regulating the temperature of the low surface-tension solvent to be pumped out to the solvent supply pipe 75 by means of the constant rate pump 77, and a filter 79 for removing foreign substances in the low surface-tension solvent. Further, the solvent supply pipe 75 is equipped with a concentration meter 80 for monitoring the IPA concentration.

Further, one end of a solvent circulation pipe 81 branches out from the solvent supplying pipe 75 between the solvent valve 76 and the concentration meter 80, and the other end of the solvent circulation pipe 81 is connected with the reservoir tank 72. A circulation valve 82 is inserted in the solvent circulation pipe 81. During the operation of the apparatus, the constant rate pump 77 and the temperature regulator 78 are driven all the time. While the low surface-tension solvent is not supplied to the substrate W, the solvent valve 76 is closed, whereas the circulation valve 82 is opened. In this way, the low surface-tension solvent which is pumped out by the constant rate pump 77 from the reservoir tank 72 returns back to the reservoir tank 72 via the solvent circulation pipe 81. In short, when the low surface-tension solvent is not supplied to the substrate W, the low surface-tension solvent circulates in the circulation path composed of the reservoir tank 72, the solvent supplying pipe 75 and the solvent circulation pipe 81. Meanwhile, at the timing for supplying the low surface-tension solvent to the substrate W, the solvent valve 76 is opened and the circulation valve 82 is closed. This provides the solvent supply passage 97 with the low surface-tension solvent which is pumped out from the reservoir tank 72. In this way, by circulating the low surface-tension solvent while it is not supplied to the substrate W, DIW and IPA get agitated, realizing a state that DIW and IPA are adequately mixed with each other. In addition, it is possible to supply quickly after the solvent valve 76 is opened to the solvent supply passage 97 the low surface-tension solvent whose temperature is adjusted to a predetermined temperature and which is free from foreign matters.

The upper ends of the gas supply passage 98 and the outer gas supply passage 99 are respectively connected with a gas supply unit 18 (FIG. 2), so that the nitrogen gas can be individually pressure-fed from the gas supply unit 18 to the gas supply passage 98 and the outer gas supply passage 99 in accordance with an operation command from the control unit 4. This enables the nitrogen gas to be supplied into the clearance space SP defined between the blocking member 9 (plate-like member 90) positioned at the facing position and the substrate surface Wf.

Fixed around the casing 2 is a receiver member 21. Cylindrical partition members 23a, 23b and 23c are disposed upright in the receiver member 21. The space between the outer wall of the casing 2 and the inner wall of the partition member 23a defines a first liquid drainage bath 25a, the space between the outer wall of the partition member 23a and the inner wall of the partition member 23b defines a second liquid drainage bath 25b, and the space between the outer wall of the partition member 23b and the inner wall of the partition member 23c defines a third liquid drainage bath 25c.

Vents 27a, 27b and 27c are formed in bottom portions of the first liquid drainage bath 25a, the second liquid drainage bath 25b and the third liquid drainage bath 25c, respectively, and the respective vents are connected to different drains from each other. In this embodiment for instance, the first liquid drainage bath 25a is a bath for collecting the chemical solution after use and is communicated with a collection drain which collects the chemical solution for reuse. Meanwhile, the second liquid drainage bath 25b is a bath for draining the rinsing liquid after use and is communicated with a waste drain which is for disposal. Further, the third liquid drainage bath 25c is a bath for draining the low surface-tension solvent after use and is communicated with a waste drain which is for disposal.

A splash guard 6 is disposed above the respective liquid drainage baths 25a through 25c. The splash guard 6 is arranged so as to surround the substrate W which is held horizontally by the spin chuck 1 and to freely ascend and descend in a direction of the rotation axis J of the spin chuck 1. The shape of the splash guard 6 is approximately rotational-symmetric to the rotation axis J of the spin chuck 1. The splash guard 6 comprises three guards 61, 62 and 63 which are arranged from the inward side to the outward side in a radial direction in a concentric layout with respect to the spin chuck 1. The three guards 61, 62 and 63 are progressively lower in the order from the outermost guard 63 to the innermost guard 61, and the top ends of the respective guards 61, 62 and 63 are aligned in the same plane which extends in the vertical direction.

The splash guard 6 is connected with a guard elevating mechanism 65 so that when an elevator driving actuator (which may for instance be an air cylinder) of the guard elevating mechanism 65 operates in response to an operation command from the control unit 4, the splash guard 6 moves up and down relative to the spin chuck 1. In this embodiment, since the splash guard 6 ascends or descends stepwise when driven by the guard elevating mechanism 65, the processing liquid splashing from the rotating substrate W is drained, split into the first through the third liquid drainage baths 25a through 25c.

An upper section of the guard 61 includes a groove-like first guiding part 61a which is open toward inside and is wedge-shaped (V-shaped) in cross section. With the splash guard 6 set to the highest position (which will hereinafter be referred to as the "first height position") during chemical processing, the chemical solution splashing from the rotating substrate W is caught by the first guiding part 61a and guided into the first liquid drainage bath 25a. Describing this in more specific details, when the splash guard 6 is at the first height position so that the first guiding part 61a surrounds the substrate W which is held by the spin chuck 1, the chemical solution splashing from the rotating substrate W is guided into the first liquid drainage bath 25a via the guard 61.

Meanwhile, an upper section of the guard 62 includes a slanted part 62a which is tilted diagonally upward from the outward side to the inward side in the radial direction. With the splash guard 6 set to a lower position than the first height position (which will hereinafter be referred to as the "second height position") during rinsing processing, the rinsing liquid splashing from the rotating substrate W is caught by the slanted part 62a and guided into the second liquid drainage bath 25b. To be more specific, when the splash guard 6 is at the second height position so that the slanted part 62a surrounds the substrate W which is held by the spin chuck 1, the rinsing liquid splashing from the rotating substrate W drops between the top end of the guard 61 and the top end of the guard 62 and is accordingly guided into the second liquid drainage bath 25b.

In a similar way, an upper section of the guard 63 includes a slanted part 63a which is tilted diagonally upward from the outward side to the inward side in the radial direction. With the splash guard 6 set to a lower position than the second height position (which will hereinafter be referred to as the "third height position") during replacing processing, the low surface-tension solvent splashing from the rotating substrate W is caught by the slanted part 63a and guided into the third liquid drainage bath 25c. In more particular words, when the splash guard 6 is at the third height position so that the slanted part 63a surrounds the substrate W which is held by the spin chuck 1, the low surface-tension solvent splashing from the rotating substrate W drops between the top end of the guard 62 and the top end of the guard 63 and is accordingly guided into the third liquid drainage bath 25c.

Further, the splash guard 6 can be set to a lower position than the third height position (hereinafter be referred to as the "retract position"), thereby making the spin chuck 1 project beyond the top end of the splash guard 6 and allowing a substrate transporter (not shown) loads the substrate W yet to be processed onto the spin chuck 1 and receives the processed substrate W from the spin chuck 1.

Next, the operation of the substrate processing apparatus constructed as above is described in detail with reference to FIGS. 5, 6A to 6E, 7A and 7B. FIG. 5 is a timing chart showing the operation of the substrate processing apparatus of FIG. 1, and FIGS. 6A to 6E, 7A and 7B are diagrams schematically showing the operation of the substrate processing apparatus of FIG. 1. In this apparatus, the control unit 4 controls the respective parts of the apparatus in accordance with the program stored in a memory (not shown) to perform a series of processing to the substrate W. Specifically, the control unit 4 causes the splash guard 6 to be positioned at the retract position so that the spin chuck 1 projects from the upper end of the splash guard 6. When an unprocessed substrate W is loaded into the apparatus by a substrate transporter (not shown) in this state, the cleaning processing (chemical processing+rinsing processing+puddle forming processing+ replaced region forming processing+replacing processing+ drying processing) is performed to the substrate W. A fine pattern made of poly-Si for instance is formed on the substrate surface Wf. Accordingly, in this embodiment, the substrate W is loaded into the apparatus with the substrate surface Wf faced up, and is held by the spin chuck 1. The blocking member 9 is at the separated position above the spin chuck 1 to avoid the interference with the substrate W.

Subsequently, the control unit 4 causes the splash guard 6 to be arranged at the first height position (position shown in FIG. 1) to perform chemical processing to the substrate W. Specifically, the chemical solution discharging nozzle 3 is moved to the discharge position and the substrate W held by the spin chuck 1 is rotated at a rotation speed (800 rpm for instance) determined within a range from 200 to 1200 rpm by the driving of the chuck rotating mechanism 13. Then, the chemical solution valve 31 is opened to supply the hydrofluoric acid as the chemical solution from the chemical solution discharging nozzle 3 to the substrate surface Wf (HF supply). The hydrofluoric acid supplied to the substrate surface Wf is spread by a centrifugal force, whereby the entire substrate surface Wf is chemically processed with the hydrofluoric acid. The hydrofluoric acid blown off from the substrate W is guided to the first liquid drainage bath 25*a* to be suitably reused.

Upon finishing chemical processing, the chemical solution discharging nozzle 3 is moved to the standby position. Then, the splash guard 6 is arranged at the second height position to perform rinsing processing as "wet processing" of the invention to the substrate W. Specifically, the rinsing liquid valve 83 is opened to discharge the rinsing liquid (DIW) from the rinsing liquid discharge port 96*a* of the blocking member 9 located at the separated position (DIW supply). Simultaneously with the discharge of the rinsing liquid, the blocking member 9 is lowered toward the facing position to be positioned thereat. By supplying the rinsing liquid to the substrate surface Wf immediately after chemical processing in this way, the substrate surface Wf can be kept wet. This is for the following reason. Specifically, when the hydrofluoric acid is blown off from the substrate W after chemical processing, the drying of the substrate surface Wf starts. As a result, the substrate surface Wf might partly become dry to form stains on the substrate surface Wf in some cases. Accordingly, it is essential to keep the substrate surface Wf wet in order to prevent such partial drying of the substrate surface Wf. Further, the nitrogen gas is discharged from the gas discharge port 98*a* and the outer gas discharge port 99*a* of the blocking member 9. Here, the nitrogen gas is mainly discharged from the outer gas discharge port 99*a*. In other words, a flow rate balance of the nitrogen gas discharged from both discharge ports is adjusted so that the nitrogen gas is discharged at a very small flow rate from the gas discharge port 98*a* while being discharged at a relatively large flow rate from the outer gas discharge port 99*a*.

With regard to the nitrogen gas flow rate shown in FIG. 5, the dashed line indicates a gas flow rate discharged from the outer gas discharge port 99*a*, and the solid line indicates a total of the gas flow rate discharged from the gas discharge port 98*a* and the outer gas discharge port 99*a*. As shown in FIG. 5, assuming, for instance, that the flow rate of discharged nitrogen gas is 100 SLM (standard liter per minute) upon supplying DIW to the substrate surface Wf as the rinsing liquid, 95 SLM out of 100 SLM is arranged to be supplied from the outer gas discharge port 99*a*, whereas the remaining 5 SLM is arranged to be supplied from the gas discharge port 98*a*.

The gas flow rate is not limited to the above. However, it is desirable that the gas flow rate from the gas discharge port 98*a* is from 5 SLM to 40 SLM, and that the gas flow rate from the outer gas discharge port 99*a* is from 95 SLM to about 100 SLM.

The rinsing liquid supplied to the substrate surface Wf from the rinsing liquid discharge port 96*a* is spread by a centrifugal force resulting from the rotation of the substrate W, whereby the substrate surface Wf is entirely rinsed (wet processing step). In other words, the hydrofluoric acid remaining to adhere to the substrate surface Wf is washed away by the rinsing liquid corresponding to a "processing liquid" of the invention and removed from the substrate surface Wf The used rinsing liquid blown off from the substrate W is guided to the second liquid drainage bath 25*b* for disposal. Further, the ambient atmosphere of the substrate surface Wf is maintained to be low oxygen concentration atmosphere by the supply of the nitrogen gas into the clearance space SP. Thus, an increase of the dissolved oxygen concentration of the rinsing liquid can be suppressed. The rotation speed of the substrate W during rinsing processing is set at 600 rpm for example (FIG. 6A).

Further, upon performing the rinsing processing described above and the processing to be described later (puddle forming processing, replaced region forming processing, replacing processing, drying processing), the plate-like member 90 of the blocking member 9 is driven to rotate in the same rotating direction and at substantially the same rotation speed as the substrate W. This will prevent the development of relative rotation speed difference between the lower surface 90*a* of the plate-like member 90 and the substrate surface Wf, thereby preventing a generation of airflow sucking in the clearance space SP. Hence, it is possible to prevent a mist-like rinsing liquid and a mist-like low surface-tension solvent from entering the clearance space SP to adhere to the substrate surface Wf. Further, by rotating the plate-like member 90, it is possible to shake off the rinsing liquid and the low surface-tension solvent adhering to the lower surface 90*a* and to prevent the rinsing liquid and the low surface-tension solvent from remaining on the lower surface 90*a*.

When the rinsing processing of predetermined duration is completed, puddle-forming processing is performed subsequently. Specifically, the control unit 4 reduces the rotation speed of the substrate W to a second speed which is slower than the first speed after the rinsing processing is completed. This allows the rinsing liquid discharged from the rinsing liquid discharge port 96*a* to be accumulated on the substrate surface Wf so that a puddle-like DIW liquid film is formed (puddle forming processing). In this embodiment, the control unit 4 sets the second speed at 10 rpm, continues the supply of the rinsing liquid just for 9 seconds, and then, closes the rinsing liquid valve 83 to stop discharging of the rinsing liquid from the rinsing liquid discharge port 96*a*. This allows a DIW liquid film to be formed as shown in FIG. 6B. Although the second speed is not limited to 10 rpm, the second speed needs to be set within the range that satisfies the condition that the centrifugal force acting on the rinsing liquid is smaller than the surface tension acting between the rinsing liquid and the substrate surface Wf. This is because the above condition must be met in order to form the liquid film of the rinsing liquid in a shape of a puddle.

After the supply of DIW is stopped, the control unit 4 waits for a predetermined time (0.5 seconds in this embodiment) so that the film thickness t1 of the puddle-like DIW liquid film becomes substantially uniform across the entire surface of the substrate W, and places the splash guard 6 at the third height position. Subsequently, the control unit 4 opens the solvent valve 76 to discharge the low surface-tension solvent from the solvent discharge port 97*a*. Here, IPA of 100% is prepared in advance in the cabinet part 70. The IPA is discharged from the solvent discharge port 97*a* toward the central part of the substrate surface Wf at a low flow rate, that is, at a flow rate of 100 (mL/min) for instance. As shown in FIG. 6C, the central part of the DIW liquid film is replaced with IPA to form a replaced region SR in the liquid film in the central part of the surface of the substrate W by the supply of IPA (replaced region forming processing).

When three seconds have passed from the start of the IPA supply, the control unit 4 accelerates the rotation speed of the substrate W from 10 rpm to 300 rpm while continuing the supply of IPA. This causes the replaced region SR to expand in a radial direction of the substrate W so that the liquid film on the entire substrate surface Wf is replaced with the low surface-tension solvent (replacing processing). In this embodiment, the rotation speed of the substrate W is accelerated in two steps as described next.

The control unit 4 accelerates the rotation speed of the substrate W from 10 rpm to 100 rpm in 0.5 seconds (first replacing processing). This acceleration of the rotation speed increases the centrifugal force acting on the liquid film on the substrate surface Wf, that is, DIW region+IPA region (replaced region SR), so that the DIW is shaken off and the replaced region SR expands in a radial direction (FIG. 6D). At this time, the thickness of the liquid film on the substrate surface Wf decreases to a thickness t2 corresponding to the rotation speed. When a predetermined time (one second in this embodiment) has passed, all the DIW that has been present in a circumferential part of the surface of the substrate W gets shaken off from the substrate W, and the replaced region SR uniformly spreads to the entire substrate surface Wf so that the entire substrate surface Wf is covered with IPA liquid film.

In the following second replacing processing, the control unit 4 accelerates the rotation speed of the substrate W from 100 rpm to 300 rpm in 0.5 seconds. This processing is performed for the purpose of replacing the rinsing liquid ("residual DIW" in FIG. 7A) remaining inside the gap of fine patterns FP formed on the substrate surface Wf with IPA. Specifically, the acceleration of the rotation speed causes the IPA on the substrate surface Wf to flow significantly, thereby replacing the residual DIW with IPA inside the gap of fine patterns FP (FIG. 7B). This ensures that the DIW adhering to the substrate surface Wf is replaced with IPA. As described above, the acceleration in the second replacing processing (=(300−100)/0.5) is greater than the acceleration in the first replacing processing (=(100−10)/0.5), and hence, the replacing efficiency of the residual DIW can be improved. Meanwhile, the used IPA shaken off from the substrate W is guided to the third liquid drainage bath 25c for disposal.

As shown in FIG. 5, a flow rate of the nitrogen gas from the gas discharge port 98a and the outer gas discharge port 99a is maintained at the same flow rate as the one in the rinsing processing until the replacing processing is completed. As described above, the rinsing processing and the replacing processing are performed while continuously supplying nitrogen gas at a relatively large flow rate and at a low speed to the substrate surface Wf in a state that the blocking member 9 is positioned closed to the substrate surface Wf. Hence, it is possible to prevent components of the chemical solution and the rinsing liquid in the mist contained in the ambient atmosphere from entering the clearance space SP. In particular, it is possible to effectively suppress the generation of watermarks attributable to mixing of a mist of the rinsing liquid into the IPA covering the substrate surface Wf during the replacing processing.

When the replacing processing is completed in this way, the control unit 4 increases the rotation speed of the chuck rotating mechanism 13 to rotate the substrate W at a high speed (1000 rpm for instance). This causes the IPA adhering to the substrate surface Wf to be shaken off and the drying processing (spin drying) of the substrate W is executed (drying processing). At this time, since the low surface-tension solvent has entered into the gap of the patterns, the destruction of patterns and the generation of watermarks can be prevented. Further, the clearance space SP is filled with the nitrogen gas supplied from the gas discharge port 98a and the outer gas discharge port 99a. Hence, the drying time is shortened and an elution of a substance which is likely to be oxidized to a liquid component (low surface-tension solvent) adhering to the substrate W is reduced, which makes it possible to more effectively suppress the generation of watermarks.

Further, in the drying processing, by increasing nitrogen gas flow rate from 100 SLM to 140 SLM (FIG. 5), the mist and the like are more effectively prevented from rolling in. At this time, the discharge amount from the outer gas discharge port 99a is changed little (from 95 SLM to 100 SLM), whereas the discharge amount from the gas discharge port 98a is greatly increased (from 5 SLM to 40 SLM). Accordingly, it is possible to supply a flow of the nitrogen gas at a high speed to the central part of the substrate surface Wf. Thus, the IPA can be efficiently discharged from the central part of the substrate to the circumferential part.

When the drying processing of the substrate W is completed, the control unit 4 controls the chuck rotating mechanism 13 to stop the rotation of the substrate W. It is desirable to continue the supply of the nitrogen gas at least until the rotation of the substrate is stopped. Then, the splash guard 6 is positioned at the retract position to make the spin chuck 1 protrude from the upper end of the splash guard 6. After that, the substrate transporter unloads the processed substrate W from the apparatus and a series of cleaning processing to one substrate W is completed.

As described above, according to this embodiment, the replaced region SR is formed and expanded while the IPA is supplied to the central part of the substrate surface Wf at a low flow rate of 100 (mL/min). Therefore, the used amount of IPA required for replacing the entire surface of the substrate with IPA can be greatly reduced compared with the above related technology, that is, replacing the entire substrate surface with IPA at once by supplying a large amount of IPA to the substrate surface.

Further, in this embodiment, the rotation speed of the substrate W is reduced to the second speed to increase the thickness of the DIW liquid film to the thickness t1, and the IPA is supplied to the central part of the surface of the substrate W while the thickness t1 is maintained, and hence, the replaced region SR replaced with IPA is formed at the central part of the substrate surface Wf. At this time, the IPA may mix into the DIW region out of the liquid film on the substrate surface Wf located around the replaced region SR. However, the generation of Marangoni convection at the mixed position can be suppressed since the thickness of the liquid film on the substrate surface Wf is relatively thick (thickness t1). As a result, it is possible to effectively prevent a problem that the substrate surface Wf is partially dried.

Here, the replacing processing may be performed by continuing the supply of IPA while maintaining the rotation speed of the substrate W at the second speed. Alternatively, the rotation speed of the substrate W may be accelerated to a rotation speed (100 rpm) higher than the second speed as in this embodiment. The reason is that the possibility of IPA getting mixed into the area surrounding the replaced region SR has become low. This is because a distance from the IPA supply position (the central part of the surface of the substrate W) to the DIW region on the substrate W has increased after the formation of the replaced region SR. Consequently, in this embodiment, the rotation speed of the substrate W is accelerated to increases the centrifugal force acting on the liquid film (DIW region+replaced region SR) on the substrate surface Wf, and to shorten the time required for the replacing with IPA. Further, the liquid film becomes thinner as the rotation speed is increased, which makes it possible to reduce the used amount of IPA required to cover the entire substrate surface.

Furthermore, the replacing processing may be ended when the entire substrate surface Wf is covered with IPA. However, in this embodiment, the rotation speed of the substrate W is increased further to 300 rpm from this state, that is, the second replacing processing is performed. Hence, it is possible to securely replace the residual DIW in the fine patterns FP with IPA. Therefore, the destruction of the patterns can be more effectively suppressed.

It should be noted that the invention is not limited to the embodiment above, but may be modified in various manners in addition to the embodiment above, to the extent not deviating from the object of the invention. For example, although the rotation speed of the substrate W is accelerated in two steps in the replacing processing in the above embodiment, the acceleration may be performed in more than two steps. Further the rotation speed of the substrate W may be accelerated continuously in the replacing processing.

Further, in the above embodiment, the replaced region forming processing is performed while rotating the substrate W at the same rotation speed as the puddle forming processing, namely at the second speed. However, the replaced region forming processing may be performed in a state that the rotation of the substrate W is stopped or that the substrate W is rotated at a speed slower than the second speed. The point is that the low surface-tension solvent is supplied to the central part of the substrate surface while the rotation speed of the substrate is maintained at the second speed or slower to form the replaced region with the low surface-tension solvent. Thus, the same effect as the above embodiment can be obtained.

In addition, in the embodiment above, IPA is used as the low surface-tension solvent. However, a liquid mixture of IPA and DIW may be generated in the cabinet part 70, and this liquid mixture may be used as the low surface-tension solvent. Further, the method of generating the liquid mixture is not limited to this. For example, the organic solvent component such as IPA may be mixed with DIW, in an in-line fashion, on a liquid feeder path which is for feeding the DIW toward the liquid supply passage of the blocking member (or the nozzle) to thereby generate the liquid mixture. Further, the liquid mixture generator such as the cabinet part is not limited to be provided inside the substrate processing apparatus. Instead, the liquid mixture, which is generated in other apparatus separately provided from the substrate processing apparatus, may be supplied to the substrate surface Wf via a blocking member which is disposed inside the substrate processing apparatus. Further, instead of the solvent containing the organic solvent component such as IPA, a solvent essentially containing a surfactant may be used.

Further, although the embodiment above use DIW as the rinsing liquid, the rinsing liquid may be a liquid which contains a component which does not exert a chemical cleaning effect upon the substrate surface Wf such as carbonated water (DIW+CO2). In such an instance, the liquid mixture obtained by mixing the organic solvent component with a liquid (carbonated water) whose composition is the same as that of the rinsing liquid adhering to the substrate surface Wf may be used as the low surface-tension solvent. Alternatively, the liquid mixture may be a mixture of the organic solvent component and DIW which is a principal component of carbonated water, while using carbonated water as the rinsing liquid. Furthermore, the liquid mixture may be a mixture of the organic solvent component and carbonated water, while using DIW as the rinsing liquid. In essence, the liquid mixture may be a mixture of the organic solvent component and a liquid whose principal component is the same as that of the liquid adhering to the substrate surface Wf. Further, the rinsing liquid may be, other than DIW and carbonated water, hydrogen water, diluted ammonia water (having the concentration of around 1 ppm for instance), diluted hydrochloric acid, or the like.

Next, examples according to the invention will be given. It is to be understood that the invention is not limited to the following examples, and that the variation may be made properly to the examples without departing from the scope suitable to the point described above and below, and those are included in the technical scope of the invention.

FIG. 8 is a timing chart showing a substrate processing method according to a comparative example. This comparative example principally differs from the embodiment (FIG. 5) of the invention in a content of processing performed between the rinsing processing and the drying processing. Specifically, the replaced-region forming processing and the replacing processing are performed after the rinsing processing is performed in the embodiment of the invention as described above. On the other hand, in the comparative example, although the rotation speed of the substrate W is reduced to 300 rpm after the rinsing processing, the liquid film is not in a form of a puddle, and the film thickness thereof is thinner. And, while the rotation speed is maintained, IPA continues to be supplied at a low flow rate (100 mL/min) for 16 seconds, and the DIW liquid film on the substrate surface Wf is replaced with the IPA liquid film. Subsequently, the rotation speed of the substrate W is accelerated to 1000 rpm to perform the drying processing.

The number of particles (particle diameter being not less than 0.06 μm) adhering to the substrate surface Wf processed as the comparative example in this way is measured using the particle measurement apparatus SP1-TBI manufactured by KLA-Tencor company. The number of particles has increased by 432 compared to the initial value of the number of adhering particles. When the substrate surface Wf is monitored, the particle distribution shown in FIG. 9A is observed. It is to be noted that each white circular line indicates the circumferential edge of the substrate W, and each white spot indicates a particle adhering to the substrate surface Wf in FIGS. 9A to 9G.

On the other hand, regarding eight pieces of substrate W, the number of particles (particle diameter being not less than 0.06 μm) adhering to the substrate surface Wf processed as working examples of the invention is measured using the above particle measurement apparatus SP1-TBI. The change in the number of particle are (+9), (+53), (−125), (−173), (−132), (−107), and (+26), respectively. It is revealed that the adhesion of particles is much more stable compared to the comparative example. Further, when the substrate surfaces Wf of six substrates W out of the eight substrates W are monitored, the particle distribution shown in FIGS. 9B to 9G was observed.

As is clear from these results, according to the invention, even when the flow rate of the low surface-tension solvent is reduced for the purpose of decreasing the used amount of the low surface-tension solvent, the substrate surface Wf can be dried excellently by performing the replaced region forming processing and the replacing processing as in the invention.

The present invention is applicable to a substrate processing apparatus and a substrate processing method which performs drying processing to a surface of substrates in general including semiconductor wafers, glass substrates for photomasks, glass substrates for liquid crystal displays, glass substrates for plasma displays, substrates for FEDs (field emission displays), substrates for optical discs, substrates for magnetic discs, and substrates for magnet-optical discs.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing method comprising:
a) a wet processing step of performing a wet processing to a surface of a substrate using a processing liquid while rotating the substrate in a substantially horizontal state at a first speed;
b) a puddle forming step of forming a puddle liquid film of the processing liquid on the substrate by reducing a rotation speed of the substrate to a second speed slower than the first speed;
c) a replaced-region forming step of forming a replaced region only in a central part of the liquid film formed on the substrate, by supplying a low surface-tension solvent whose surface tension is lower than that of the processing liquid only to the central part of the liquid film formed on the substrate while maintaining the rotation speed of the substrate at a third rotation speed not more than the second speed, the replaced region being formed by replacing the processing liquid with the low surface-tension solvent;
d) a replacing step of replacing the liquid film of the entire substrate surface with the low surface-tension solvent by continuing to supply the low surface-tension solvent to the central part of the substrate surface, while rotating the substrate at a rotation speed faster than the third rotation speed, to expand the replaced region in a radial direction of the substrate; and
e) a drying step of drying the substrate surface by removing the low surface-tension solvent from the substrate surface after the replacing step.

2. The substrate processing method of claim 1, wherein in the replacing step, the substrate is rotated at a rotation speed faster than the second speed.

3. The substrate processing method of claim 2, wherein the rotation speed of the substrate is accelerated with time in the replacing step.

4. The substrate processing method of claim 3, wherein
the rotation speed of the substrate is accelerated in a stepwise fashion in the replacing step, and
the acceleration in increasing the rotation speed is increased in accordance with an increase of the rotation speed.

* * * * *